United States Patent
Primack et al.

(10) Patent No.: US 10,488,487 B2
(45) Date of Patent: Nov. 26, 2019

(54) SYSTEM FOR MAPPING ELECTROMAGNETIC DISCHARGE FIELDS

(71) Applicant: PDP-TECHNOLOGIES LTD, Ashkelon (IL)

(72) Inventors: Harel Primack, Rishon Le Zion (IL); Moti Itzkovich, Petach Tikva (IL)

(73) Assignee: PDP-TECHNOLOGIES LTD., Ashkelon (IL)

( * ) Notice: Subject to any disclaimer, the term of this patent is extended or adjusted under 35 U.S.C. 154(b) by 18 days.

(21) Appl. No.: 15/561,420

(22) PCT Filed: Mar. 13, 2016

(86) PCT No.: PCT/IL2016/050266
§ 371 (c)(1),
(2) Date: Sep. 25, 2017

(87) PCT Pub. No.: WO2016/151571
PCT Pub. Date: Sep. 29, 2016

(65) Prior Publication Data
US 2018/0106880 A1    Apr. 19, 2018

Related U.S. Application Data

(60) Provisional application No. 62/137,837, filed on Mar. 25, 2015.

(51) Int. Cl.
*G01R 35/00* (2006.01)
*G01R 31/12* (2006.01)
(Continued)

(52) U.S. Cl.
CPC ......... *G01R 35/005* (2013.01); *G01R 31/001* (2013.01); *G01R 31/1227* (2013.01);
(Continued)

(58) Field of Classification Search
CPC .... G01R 31/024; G01R 31/025; G01R 31/08; G01R 31/12; G01R 31/1272; G01R 31/14;
(Continued)

(56) References Cited

U.S. PATENT DOCUMENTS

| | | | | |
|---|---|---|---|---|
| 4,812,995 A | * | 3/1989 | Girgis | H02H 3/40 324/512 |
| 6,313,640 B1 | * | 11/2001 | Nasrallah | G01R 31/1272 324/522 |

(Continued)

FOREIGN PATENT DOCUMENTS

WO    2013/144760 A1    10/2013

OTHER PUBLICATIONS

International Search Report, dated Sep. 19, 2016 for International Application No. PCT/IL2016/050266.
(Continued)

*Primary Examiner* — Steven L Yeninas
(74) *Attorney, Agent, or Firm* — Smith Tempel Blaha LLC; Gregory Scott Smith

(57) ABSTRACT

A system and method that provide a means to overcome errors in determining the source of an electromagnetic event due to reflection, absorption and scattering of the electromagnetic field due to metallic parts of the electric equipment.

3 Claims, 5 Drawing Sheets

(51) Int. Cl.
*H04Q 9/00* (2006.01)
*G01R 31/00* (2006.01)

(52) U.S. Cl.
CPC .............. *H04Q 9/00* (2013.01); *G01R 31/005* (2013.01); *H04Q 2209/43* (2013.01); *H04Q 2209/845* (2013.01)

(58) Field of Classification Search
CPC ..........................................................................
G01R 31/027; G01R 31/1227; G01R 31/001; G01S 5/06; G01S 5/0294
USPC ....... 324/512, 534, 535, 536, 544, 522, 523, 324/500, 527, 532, 547; 702/58, 59, 79, 702/89, 94, 95
See application file for complete search history.

(56) References Cited

U.S. PATENT DOCUMENTS

| | | | | |
|---|---|---|---|---|
| 6,317,602 B1* | 11/2001 | Wesby | .................. | G01S 5/0221 342/465 |
| 6,345,236 B1* | 2/2002 | Bertheau | ................ | G01R 31/12 702/107 |
| 6,563,319 B1* | 5/2003 | Kraz | ....................... | G01R 29/12 324/458 |
| 6,774,639 B1* | 8/2004 | Unsworth | .......... | G01R 31/1227 324/535 |
| 6,801,873 B1 | 10/2004 | Jin et al. | | |
| 9,372,221 B1* | 6/2016 | Bierman | ................ | G01R 31/14 |
| 2006/0164099 A1* | 7/2006 | Steennis | .................. | H04B 3/56 324/536 |
| 2008/0157988 A1* | 7/2008 | Lai | ..................... | G01R 31/1272 340/635 |
| 2009/0119035 A1* | 5/2009 | Younsi | ............... | G01R 31/1227 702/58 |
| 2010/0013494 A1* | 1/2010 | Twerdochlib | ........ | G01R 31/346 324/536 |
| 2010/0079148 A1* | 4/2010 | Park | .................... | G01R 31/1254 324/536 |
| 2010/0271002 A1* | 10/2010 | Wakimoto | ......... | G01R 31/1272 324/76.21 |
| 2010/0295555 A1* | 11/2010 | Emanuel | ................ | G01R 31/14 324/601 |
| 2011/0172938 A1 | 7/2011 | Gu et al. | | |
| 2012/0265458 A1* | 10/2012 | Agapiou | ................ | G01R 31/34 702/59 |
| 2012/0327745 A1 | 12/2012 | Yardibi et al. | | |
| 2014/0043035 A1* | 2/2014 | Klapper | .................. | G01R 31/08 324/532 |
| 2015/0091598 A1* | 4/2015 | Han | .................... | G01R 31/1227 324/754.25 |
| 2015/0177279 A1* | 6/2015 | Ohtsuka | ............. | G01R 31/1272 702/66 |
| 2015/0268292 A1* | 9/2015 | Hwang | .............. | G01R 31/1236 324/536 |
| 2016/0003782 A1* | 1/2016 | Von Herzen | ....... | G01N 29/2418 73/655 |
| 2018/0011137 A1* | 1/2018 | Bock | .................... | G01R 31/027 |

OTHER PUBLICATIONS

Written Opinion of the International Searching Authority, dated Sep. 19, 2016 for International Application No. PCT/IL2016/050266.

Moore P.J., Portugues I., Glover I.A., "A nonintrusive partial discharge measurement system based on RF technology" Power Engineering Society General Meeting, 2003, IEEE (vol. 2).

Moore P.J., Portugues I., Glover I.A., "Partial Discharge Investigation of a Power Transformer Using Wireless Wideband Radio-frequency Measurements." IEEE Transactions on Power Delivery. vol. 21. 2006. pp. 528-530.

Moore P.J., Portugues I., Glover I.A., "RF based discharge early warning system for air-insulated substations." IEEE Transactions on Power Delivery. vol. 24. 2009. pp. 20-29.

* cited by examiner

SYSTEM FOR MAPPING ELECTROMAGNETIC DISCHARGE FIELDS

TECHNOLOGY FIELD

The present system and method relate to the field of mapping the location of the source of electric discharges in electric equipment and electric transmission lines.

BACKGROUND

Partial Discharge (PD) phenomena are defined by IEC 60270 as localized dielectric breakdowns of a small portion of a solid or liquid electrical insulation system under high voltage (HV) stress. PD can occur in voids within solid insulation, across the surface of insulating material due to contaminants or irregularities, or within gas bubbles in liquid insulation or around an electrode in gas (corona activity). PD causes the insulation to deteriorate progressively and can lead to electrical breakdown. The ultimate failure of HV assets is often sudden, catastrophic and resulting in major damage and network outages.

Periodic PD off-line spot testing of the HV equipment in Electrical Substation (ES) has been used to provide a long term trending of PD activity. However, these spot tests can sometimes fail to identify failures related to electrical loads, environmental such as temperature or humidity conditions, equipment duty cycle, or seasonal related insulation problems.

In contrast to off-line testing, on-line PD testing and monitoring gives an accurate picture of the HV equipment in the ES, health and performance under normal service conditions including the effect of load, temperature and humidity.

The continuous monitoring of PD activity in HV equipment is now accepted as an effective method to identify trends of localized damage or insulation degradation in HV equipment before failure. The occurrence of PD is detectable as:

Electromagnetic emissions, in the form of short pulses of current and radio waves emission, light and heat.

Acoustic emissions, in the audible and ultrasonic ranges

Ozone or Nitrous Oxide

PD events can be detected by various types of sensors which can be placed in, or in the vicinity of HV equipment. These sensors include;

High frequency current transducer (HFCT) sensor which is clamped around the case of the component being tested and connected to the ground;

Ultra High Frequency (UHF) sensor which measures PD activity in the form of pulses of UHF radio waves;

Transient Earth Voltage (TEV) sensor which measures the induced voltage spikes on the surface of the metal surrounding the HV component;

Ultrasonic (US) sensor which measures the wide band sound waves created by the mechanical shock wave associated with the PD event. Ultrasonic sensors can be positioned in the interior or the exterior of the component under examination.

Chemical sensors can detect the breakdown of HV equipment material into its chemical components due to a PD event. The two primary chemical tests employed are Dissolved Gas Analysis (DGA), and High Performance Liquid Chromatography (HPLC).

The sensors for PD detection described above require multiple connections to the HV equipment. All the technologies require at least one sensor per HV component and some of the sensors are required to be internally located in the HV equipment. An alternative approach, which does not require internal placement of sensors, is a noncontact, remote-sensing technology, such as the detection of radio-frequency (RF) radiation emissions emitted during a PD event. The sensors for PD detection described above require multiple connections to the HV equipment. All the technologies require at least one sensor per HV component and some of the sensors are required to be internally located in the HV equipment (see "Recent trends in the condition monitoring of transformers: Theory implementation and analysis" by: Sivaji Chakravorti; Debangshu Dey; Biswendu Chatterjee, London: Springer, 2013). An alternative approach, which does not require internal placement of sensors, is a noncontact, remote—sensing technology, such as the detection of radio—frequency (RF) radiation emissions emitted during a PD event (see Moore P. J., Portugues I., Glover I. A., "A nonintrusive partial discharge measurement system based on RF technology" Power Engineering Society General Meeting, 2003, IEEE (Volume: 2)

The RF radiation from a PD event consists of several individual high-energy, wide-band pulses ranging in length from a few nanoseconds to a few microseconds. The RF radiation occurs because once a discharge is initiated, the electrons which comprise the current of the HV equipment, are quickly depleted in the created gap, either by striking the point electrode or by attachment to gas-phase molecules. The rise time of the resulting PD pulse is sufficiently fast to extend into the RF spectrum and cause the electrically attached, supporting structures such as bus-bars, bushings, etc. to emit the impulse response RF radiation. The resulting pulses are localized, and depending on the pulses magnitude, can be readily measured within typical distances of 100 to 200 meters. The pulses of the RF radiation pulses may be detected by a continuous RF monitoring system in the range of 500-2500 MHz comprised of an antenna array and RF receivers which are located within the ES.

The ES environment is particularly onerous for RF radiation detection. RF noise, which includes RF pulses, is generated by a wide range of energized equipment which contains stressed insulation. The main challenge of a RF based PD sensing system is to distinguish between RF noise, like operating switchgear, circuit breakers and voltage switches, and PD phenomena (see Moore P. J., Portugues I., Glover I. A., "Partial Discharge Investigation of a Power Transformer Using Wireless Wideband Radio—frequency Measurements." IEEE Transactions on Power Delivery. Vol. 21. 2006. pp. 528-530). In RF detection of the PD signal the localization of the faulted HV element within the ES is essential. Previous work treated the localization problem as free space localization and employed standard triangulation methods (see Moore P. J., Portugues I., Glover I. A., "RF based discharge early warning system for air—insulated sub stations." IEEE Transactions on Power Delivery. Vol. 24. 2009. pp 20-29). In this work, errors in the range of several Meters have been reported. Since the area of the Electrical substation (ES) contains a large amount of high power and high voltage electrical equipment, the area is saturated with a wideband electromagnetic noise. The wideband electromagnetic noise reduces the Signal to Noise Ratio (SNR), and obscures the detection of PD signals, which results in the large location errors.

In addition to the electromagnetic noise, the PD signal can be reflected, attenuated, scattered, and absorbed by the different metallic structures of the high voltage equipment. The distortions in the PD signal and the environmental ES's electromagnetic noise hinder the detection and localization of the PD source. An additional approach to PD detection is described in U.S. Pat. No. 7,467,049. Hence a system and method for improving the localization accuracy and detection SNR by overcoming the electromagnetic noises and the distortions in the PD signal due to high power and high voltage equipment is required.

Glossary

High Voltage Equipment—as used in the current disclosure is equipment used in the generation, transmission, and distribution of the electrical power net.

Electrical Substation—as used in the current disclosure means an area or several non-contingent areas containing high voltage equipment.

Internal Partial Discharge—as used in the current disclosure means an electrical discharge or arc emanating from high voltage equipment.

Common time base—as used in the current disclosure is a means to have all receivers register their electromagnetic events using the same time reference.

Common processing platform—as used in the current disclosure means a device which aggregates all the electromagnetic events from the receivers and processes them according to the algorithms defined in the disclosure.

Mobile electromagnetic source—as used in the current disclosure means a device which emits electromagnetic radiation for mapping the electromagnetic response of the electrical substation.

Antenna—as used in the current disclosure means an element for converting electromagnetic events into electrical signals.

Analog unit—for amplifying, filtering and conditioning the electrical RF signal from the antenna Signal processing unit—as used in the current disclosure means a device for converting the electrical signal from the RF to a digital signal and processing the digital signal according to the algorithms described in the disclosure.

Communication unit—as used in the current disclosure means a device which connects the receiver to the common processing unit.

Data unit—as used in the current disclosure means a device which contains data relating to the operation of the receiver.

Receiver unit—which comprises of the analog unit, the signal processing unit, data unit and the communication unit.

SUMMARY OF THE DISCLOSURE

The present document discloses a system and method that includes a common time base; three or more receivers each connected to an electromagnetic antenna for receiving aerial transmission from Partial Discharge (PD) events; a common processing platform; a communication unit connecting the receivers to the common processing platform via a communication protocol; wherein the three or more antennas location defines an area of interest where PD events are detected; wherein the common processing unit contains electromagnetic localized calibration data of the area of interest, which is obtained by a calibration procedure and wherein the time of arrival in each receiver is modified according to the localized calibration data.

In a further example a system and method include a common time base; four or more receivers each connected to an electromagnetic antenna for receiving aerial transmission from Partial Discharge (PD) events; a common processing platform; a communication unit connecting the four or more receivers to the common processing platform via a communication protocol; wherein the four or more antennas location defines a volume of interest where PD events are detected; wherein the common processing unit contains electromagnetic localized calibration data of the volume of interest, which is obtained by a calibration procedure and wherein the time of arrival in each receiver is modified according to the localized calibration data.

DESCRIPTION

Figure 1:
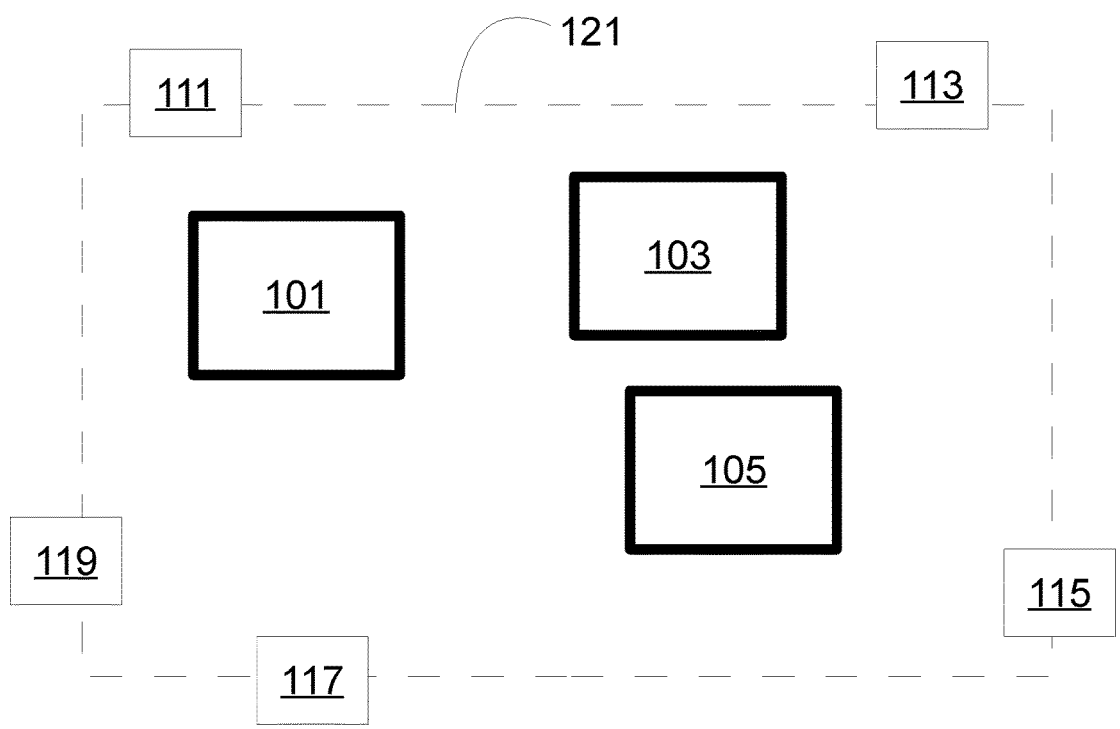
FIG. 1 is an example of an electrical substation with high voltage equipment and receivers for detecting PD events.

FIG. 1 is an example of an electrical substation (121) with high voltage equipment (101, 103, 105) and receivers (111, 113, 115, 117) for detecting PD events. In one example the electrical substation (121) can be an enclosed area containing the high voltage equipment (101, 103, 105). The substation area can range from ten square meters to a few hundred square meters. In another example, the electrical substation can be several, non-contingent areas. In still another example the electrical substation area (121) can include one or more high voltage pieces of equipment (101, 103, 105). Examples of high voltage equipment include various types of transformers including power transformers, current transformers and voltage transformers, switchgears, circuit breakers, shunt capacitors, filters, and reactors. In one example, the receivers (111, 113, 115, 117) are designed to detect electromagnetic radiation which is typical of PD events. The receivers also detect electromagnetic noise. By using suitable electronic analog or digital filters the receivers (111, 113, 115, 117) can enhance the PD detected power over the electromagnetic noise. In one example, the receivers (111, 113, 115, 117) share a common time base. In one example the time base is a local time synchronized to a common source. In another example, the time base is an accurate clock such as an atomic clock. In another example, the time base is a common time base to all receivers (111, 113, 115, 117). The receivers send the received signal to a common processing platform. The time base is maintained by the common processing platform. The common processing platform can be an external system (119) or an element in one of the receivers (e.g. 111).

Figure 2:
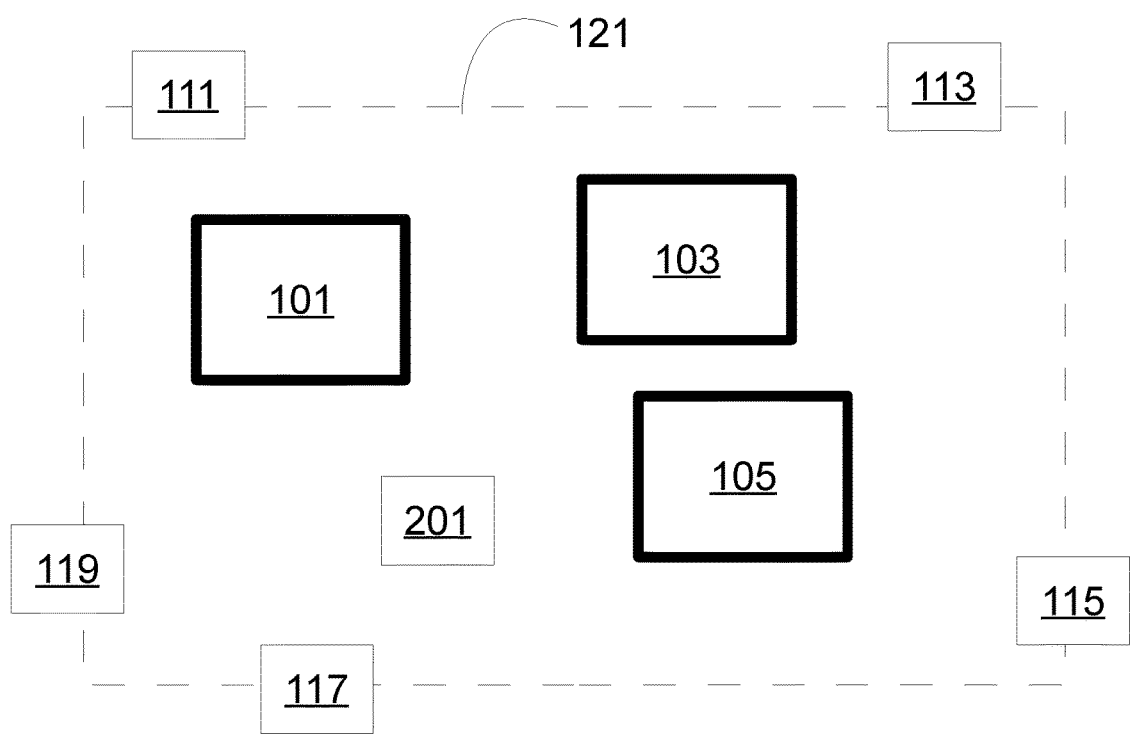
FIG. 2 is an example of is an example of an electrical substation with high voltage equipment and receivers for detecting PD events and mobile electromagnetic source for electromagnetic mapping of the electrical substation.

FIG. 2 is an example of an electrical substation (121) with high voltage equipment (101, 103, 105) and receivers (111, 113, 115, 117) for detecting PD events and mobile electromagnetic source (201) for electromagnetic mapping of the electrical substation (121). Examples of the transmitted signal from the mobile electromagnetic source (201) include;

A short electromagnetic pulse, where the frequency spectrum of the pulse should overlap the frequencies common in PD signals.

Multiple narrow frequency band signals, emitted concurrently or serially and overlapping the frequencies common in IP signals.

A spread spectrum signal obtained by a sequence of short pulses. Examples of spread spectrum signals are PD sequences.

In one example the electromagnetic source (201) emits an omni-directional signal. The source is operated from multiple transmit locations in the electrical substation (121). Examples of transmit locations can include;

The intersection points of a fine two dimensional grid where a grid intersection point is typically 1.0 meters and at least 30 cm from an adjacent grid intersection point.

The intersection points of a coarse two dimensional grid where grid intersection point is typically 5.0 meters and at most 1.5 meters from an adjacent point.

The intersection points of a two dimensional grid at multiple heights.

The location of the high voltage equipment (101, 103, 105).

The receiver (111, 113, 115, 117) antenna is used as a transmitting antenna for the beacon.

Figure 3:
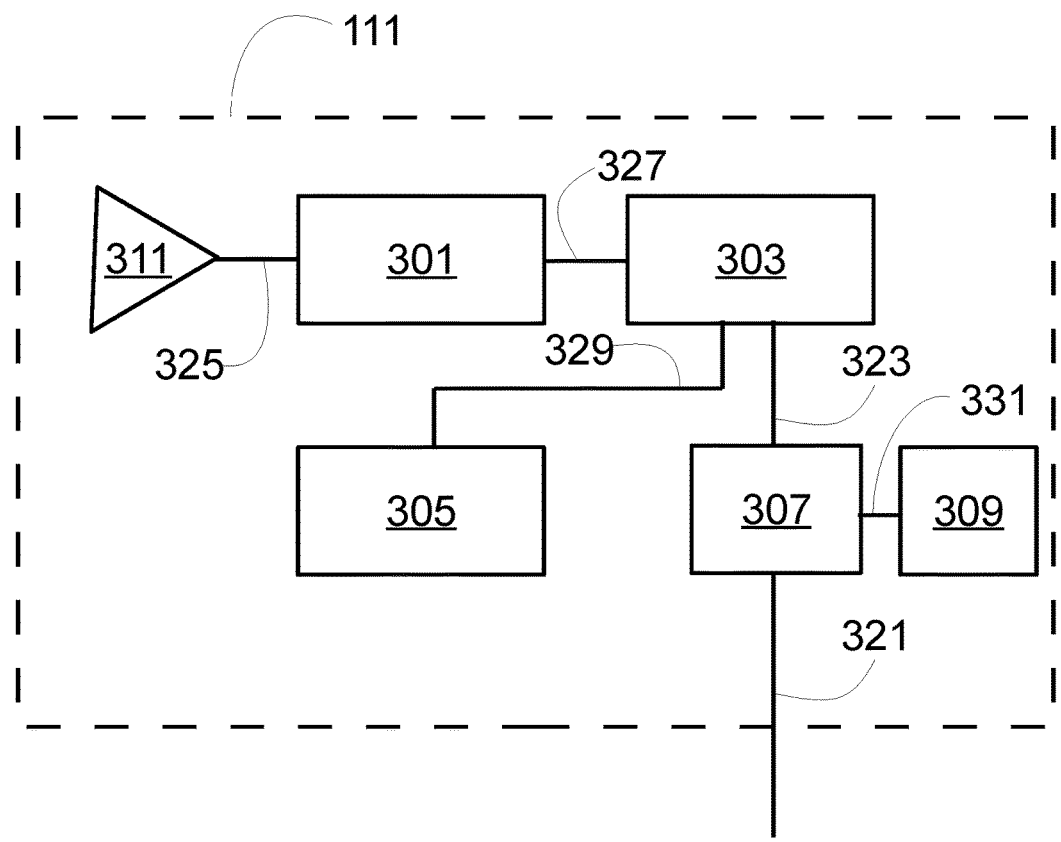
FIG. 3 is an example of the present receiver for detecting PD events.

FIG. 3 is an example of a receiver (111) for detecting PD events. The receiver includes an antenna (311), a RF unit (301), a signal processing unit (303), data unit (305) and a communication unit (307). Examples of antenna include omnidirectional antenna, such as whip, dipole, conical, biconical antenna and directional antenna such as; horn; Vivaldi, log periodic, parabolic, Yagi, fractal or phased array antenna. The antenna is designed to receive electromagnetic signals including PD signals. A PD signal is a very narrow pulse with a corresponding ultra-wide band (UWB) spectrum signal in the frequency domain. These pulses may be as narrow as 1-2 nanoseconds with raise/fall time in the order of few tenths of nanoseconds. To detect such pulses with high fidelity i.e. to be able to reconstruct the pulse shape the antenna has to have a bandwidth of few GHz and linear phase delay throughout the entire relevant spectrum. The antenna converts the received electromagnetic signal to an electric RF signal which is transferred via RF line 325 to the RF unit (303). In one example, the RF unit (303) filters the RF signal to enhance the PD signal to electromagnetic noise ratio and samples the RF signal to obtain a digital signal. The digital signal is processed by signal processing unit (305). In one example, the resulting digital signal is deformed due to the reflections, attenuation, scattering, and absorption of the metallic structures of the high voltage equipment (101, 103, 105 in FIG. 2) present in the electric power substation. The signal processing unit (305) processes the digital signal according to the calibration data from the data unit (305). The processed digital signal is sent via the communication unit (307) to common processing platform (119 in FIG. 2). The receiver (111) supports a common time base for processing the digital signal from multiple receivers (111, 113, 115, 117 in FIG. 2). In one example the common time base is provided by an accurate clock (309). In another example the accurate clock can be an atomic clock. In another example the accurate clock (309) can be embedded in the communication unit (307). In another example the clock is generated by the common processing platform (119 in FIG. 2) and distributed to the receiver (111) by the communication channel (321). In another example each source—receiver pair is synchronized to a common time base for the purpose of ToA measurements. The measurements may take place in parallel if all the pairs are synchronized simultaneously or in series if only one pair is synchronized at a time.

Figure 4:
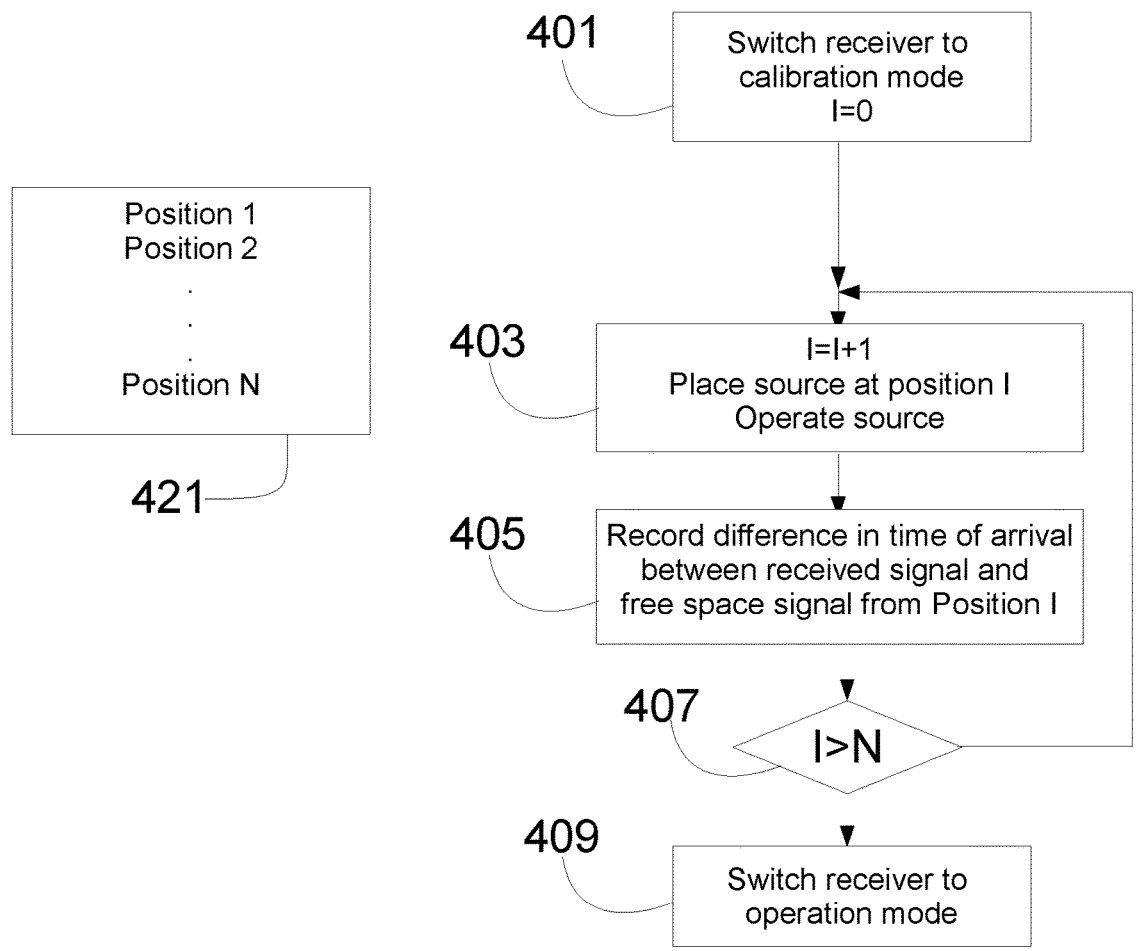
FIG. 4 is an example of an instruction flow for mapping the electromagnetic field.

FIG. 4 is an example of an instruction flow for generating the calibration data which is stored in the data unit (305 in FIG. 3).

The system initiates a calibration procedure described in Block 401. In course of the calibration process the receiver (111 in FIG. 3) is switched to calibration mode, parameters are initialized, as an example the location reference is set to 0. The main section of the process is a loop composed of two blocks (403, 405). Block 403 contains instructions related to the electromagnetic mobile source (201 in FIG. 2). Examples of instructions could include;

Increment the counter I by one;

Retrieve a geometric location from the position memory block 421;

Place the electromagnetic mobile source (201 in FIG. 2) at the position I

Transmit a signal from the electromagnetic mobile source (201 in FIG. 2).

Block 405 contains instructions related to the receiver. One example of the instructions could be;

Receive an electromagnetic event;

Convert the electromagnetic event to a digital signal;

Record signal Time of Arrival (ToA) in data unit with reference to position I.

Another example of a set of instructions is;

Receive an electromagnetic event;

Convert the electromagnetic event to a digital signal;

Difference signal is difference between actual ToA and the calculated ToA signal based on free space transmission from position I;

Record difference signal in data unit or common processing platform with reference to position I.

The algorithm is operated in parallel for at least three receivers (111, 113, 115, 117) and may work in series if the receivers are synchronized to the source.

Block 407 illustrates the condition for exiting the algorithm loop. In one example, the exit condition is when all positions have been chosen. Block 409 contains the instructions to prepare the receiver for operation mode.

In one example the recorded data is a set of values obtained by subtracting the ToA of the received signal from calculated samples of the calculated ToA in free space. For an additional set of locations the difference signal is computed from the previously calculated difference signal using Kalman filtering.

In another example, after performing a calibration procedure, the common processing platform processes the calibration data and generates preferred positions for the receivers (111, 113, 115, 117 in FIG. 2) and new transmit locations for the electromagnetic source and the calibration procedure is repeated.

Figure 5:
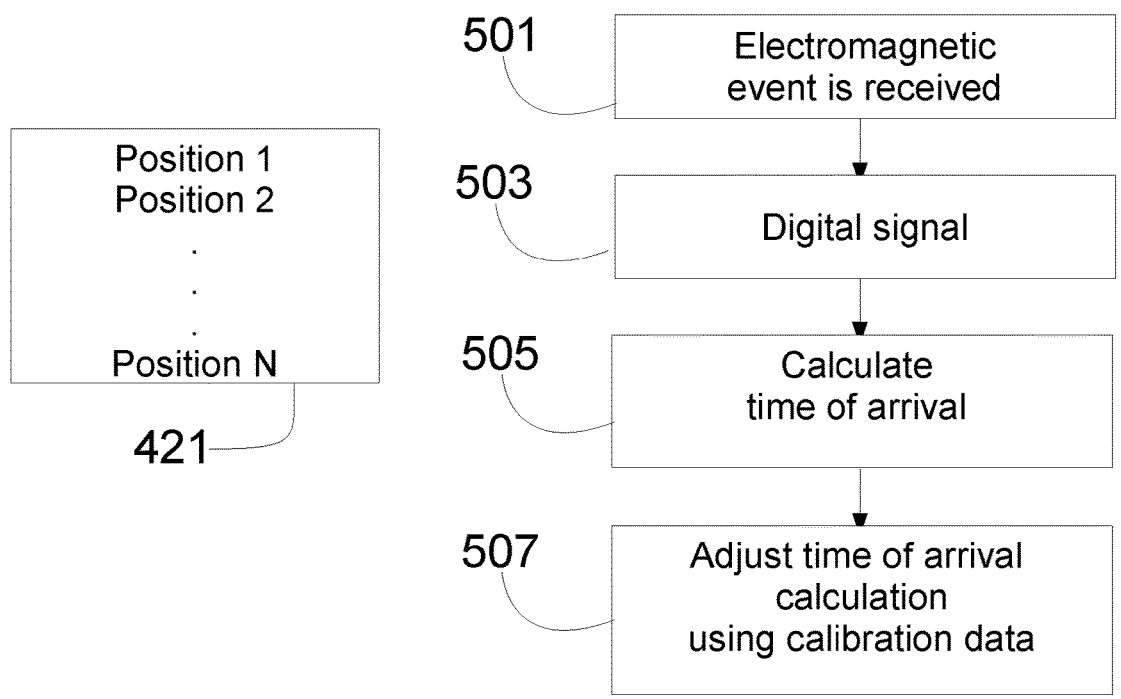
FIG. 5 is an example of an instruction flow for finding the location of an electromagnetic event.

FIG. 5 is an example of a process for a receiver in operation mode. Block 501, describes the required action for receiving the electromagnetic event at the receiver (111 in FIG. 3) antenna (311 in FIG. 3). Block 503 describes the functions required to generate a digital signal from the electromagnetic event. The ToA is derived in (Block 505). The distance of the electromagnetic event from the receiver is corrected according to the calibration data (Block 507).

To sum we describe a system for detecting PD events comprising; a common time base; three or more receivers for receiving PD events; A common processing platform; A communication unit connecting the receivers to the common processing platform via a communication protocol; Wherein the receivers include a data unit with EM localized calibration data which is obtained by a calibration procedure. In one example, the calibration procedure includes a mobile electromagnetic source which transmits in multiple locations. In an additional example the calibration procedure includes a mobile electromagnetic source which transmits one or more electromagnetic pulses. In an additional example the calibration procedure includes a mobile electromagnetic source which transmits one or more narrow band electromagnetic signals. In an additional example the calibration procedure includes a mobile electromagnetic source which transmits a spread spectrum electromagnetic signal, In another example the calibration procedure includes an array of beacons located at fixed positions.

In an additional example the common time base is generated by the common processing platform and shared with the receivers via the communication unit. In an additional example the communication protocol is one of Ethernet, Wifi, USB, Zigbee, Bluetooth, IEC-61850, IEC-60870, DNP3. In another example the mobile electromagnetic source emits electromagnetic pulses. In another example the mobile electromagnetic source emits an electromagnetic signal composed of two or more narrow band electromagnetic signals.

The examples provided above are applicable to a two dimensional area where all PD events are assumed to occur at the same height, or in the same plane. The extension of the examples above to a three dimensional volume is straight forward and the same algorithms and devices can be used for identifying location in a three dimensional volume. In two dimensional space at least three receivers are needed while in three dimensional space at least four receivers are needed.

In one example we describe a method for calibrating a system for detecting PD events comprising; Placing a mobile electromagnetic source at multiple locations in the electric substation; At each location; transmitting an electromagnetic event from said mobile electromagnetic source; Receiving said electromagnetic event at three or more receivers; Generating a ToA value corresponding to the time between transmission and reception of said electromagnetic event; Storing said ToA value, and the distance of said location divided by the electromagnetic event group delay speed in the data unit. In another example we describe a method for calibrating a system for detecting PD events comprising; Placing a mobile electromagnetic source at multiple locations in the electric substation; At each location; transmitting an electromagnetic event from said mobile electromagnetic source; Receiving said electromagnetic event at three or more receivers; Amplifying, filtering, conditioning and sampling the electromagnetic event to generate a digital signal. Storing the distance of said location divided by the electromagnetic event group delay speed and the digital signal in the data unit or common processing platform. In an additional example we describe a method for calibrating a system for detecting PD events comprising; Placing a mobile electromagnetic source at multiple locations in the electric substation; At each location; transmitting an electromagnetic event from said mobile electromagnetic source; Receiving said electromagnetic event at three or more receivers; Applying a Kalman filter to enhance said digital signal; Generating a ToA value corresponding to the time between transmission and reception of said electromagnetic event; Storing said time delay value, and the distance of said location divided by the electromagnetic event group delay speed in the data unit or in the common processing unit.

What is claimed:

1. A method for calibrating a system for detecting partial discharge (PD) events comprising:
   sequentially placing a mobile electromagnetic source at multiple locations in a designated area of an electric substation;
   at each location, transmitting an electromagnetic event from said mobile electromagnetic source;
   receiving said electromagnetic signal at three or more antennas, wherein the three or more antenna locations define an area of interest where PD events are expected to occur after the calibration procedure and the antennas are connected to receivers;
   for each receiver, generating a time of arrival value corresponding to the time between transmission and reception of said electromagnetic signal; and
      storing said time of arrival value, and the distance between the location of the electromagnetic source and the location of the antenna, in the data unit;
   wherein after the calibration procedure the data unit provides a look up table with a time delay value as input, and calibrated distance as an output.

2. A method for calibrating a system for detecting partial discharge (PD) events comprising:
   sequentially placing a mobile electromagnetic source at multiple locations in a designated area of an electric substation;
   at each location, transmitting an electromagnetic signal from said mobile electromagnetic source;
   receiving said electromagnetic signal at three or more antennas, wherein the three or more antenna locations define an area of interest where PD events expected to occur after the calibration procedure and the antennas are connected to receivers;
   at each receiver, the electromagnetic signal generates an electric analog signal which is processed to generate a digital signal;
   the receiver further generates a time of arrival value corresponding to the time between transmission and reception of said electromagnetic signal; and storing said time of arrival value, the distance between the location of the electromagnetic source and the location of the antenna, and the said digital signal in the data unit;
   wherein after the calibration procedure the data unit provides a look up table with a digital signal as input, and calibrated distance as an output.

3. A method for calibrating a system for detecting partial discharge (PD) events comprising:
   placing a mobile electromagnetic source at multiple locations in an electric substation;
   at each location, transmitting an electromagnetic signal from said mobile electromagnetic source;
   receiving said electromagnetic signal at three or more receivers;
   amplifying, filtering, conditioning and sampling the electromagnetic signal to generate a digital signal;
   generating a time of arrival value corresponding to the time between transmission and reception of said electromagnetic signal;
   storing said time of arrival value, and a distance of said location in the common processing platform; and
   extrapolating time of arrival values for additional locations by applying a Kalman filter to stored time of arrival values.

* * * * *